United States Patent
Yang et al.

(10) Patent No.: US 10,910,083 B2
(45) Date of Patent: Feb. 2, 2021

(54) LEAKY MEMORY HOLE REPAIR AT FABRICATION JOINT

(71) Applicant: Western Digital Technologies, Inc., San Jose, CA (US)

(72) Inventors: Xiang Yang, Santa Clara, CA (US); Gerrit Jan Hemink, San Ramon, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/354,034

(22) Filed: Mar. 14, 2019

(65) Prior Publication Data

US 2020/0294615 A1 Sep. 17, 2020

(51) Int. Cl.
*G11C 29/44* (2006.01)
*G11C 7/14* (2006.01)
*G11C 16/12* (2006.01)
*G11C 29/24* (2006.01)
*G11C 29/12* (2006.01)

(52) U.S. Cl.
CPC .......... *G11C 29/4401* (2013.01); *G11C 7/14* (2013.01); *G11C 16/12* (2013.01); *G11C 29/24* (2013.01); *G11C 2029/1202* (2013.01); *G11C 2029/1204* (2013.01)

(58) Field of Classification Search
None
See application file for complete search history.

(56) References Cited

U.S. PATENT DOCUMENTS 9,530,517 B2 * 12/2016 Lee ............... G11C 11/5635
9,547,571 B2 * 1/2017 Yang ............... G11C 16/3404
9,852,803 B2 * 12/2017 Diep ............... G11C 16/08

* cited by examiner

*Primary Examiner* — Phung M Chung
(74) *Attorney, Agent, or Firm* — Vierra Magen Marcus LLP

(57) ABSTRACT

A memory array with a fabrication joint includes a controller configured to apply a detection voltage on a word line coupled to a plurality of bitlines, count a number of bitlines having a first type of response to the detection voltage, and on condition that the number of bitlines exceeds a configured value, program memory cells on at least one dummy word line adjacent to the fabrication joint with a particular threshold voltage.

20 Claims, 12 Drawing Sheets

10,910,083 B2

LEAKY MEMORY HOLE REPAIR AT FABRICATION JOINT

BACKGROUND

Modern memory devices push the limits of fabrication technology by packing memory cells into smaller and smaller areas. The density of memory cells in a memory device may become so dense that electron leakage contributes to memory failure.

One issue with memory devices that are high density is they often have one or more fabrication joints in the memory array. These fabrication joints allow for higher density arrays of memory cells, and thus higher capacity memory devices. Unfortunately the presence of a fabrication joint can lead to problems.

One known issue is that the fabrication joint may leak charge between adjacent memory strings in a high-density memory cell array, especially in the presence of fabrication errors. Memory strings are also referred to herein as 'memory channels'. This leakage can lead to programming difficulties and/or inaccurate results when the memory is programmed or read.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Disclosed herein are embodiments of a memory device having a memory array with a fabrication joint. A "fabrication joint" is an area along a memory channel configured to electrically and physically couple one part of the memory channel to either another part of the memory channel, a part of another memory channel, and/or another component in a non-volatile memory structure. In certain example embodiments, a fabrication joint electrically and physically connects two ends of two different memory channels, each fabricated at different stages in a fabrication process. A dummy word line is a word line coupled to memory cells that don't store data bits (dummy memory cells). A memory channel is a path for charge flow formed by transistor devices in series. In certain embodiments a memory channel electrically couples a bitline and a source line in a memory device, as illustrated and discussed in more detail to follow.

The memory device controller may be configured to apply a detection voltage on a word line coupled to a plurality of bitlines and to count a number of bitlines having a first type of response to the detection voltage. On condition that the number of bitlines exceeds a configured value, memory cells on at least one dummy word line adjacent to the fabrication joint are programmed with a particular threshold voltage. A threshold voltage of a transistor-based memory cell is a gate voltage above which the memory cell will conduct current between its source and drain regions.

Figure 1:
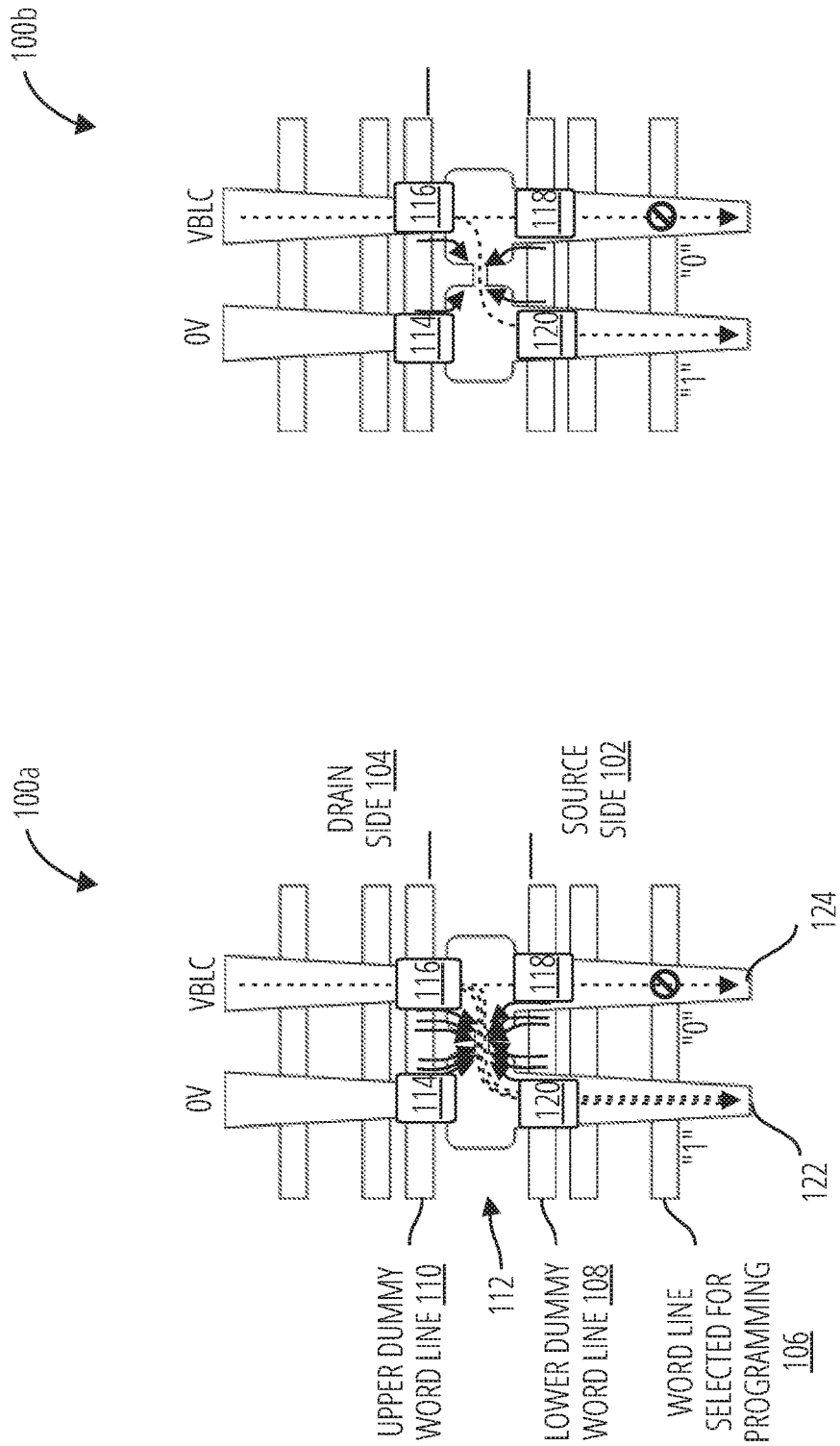
FIG. 1A illustrates memory channels 100a having inter-memory channel leakage.
FIG. 1B illustrates memory channels 100b after repair of inter-memory channel leakage in accordance with one embodiment.

FIG. 1A and FIG. 1B depict examples of inter-memory-channel leakage current before and after repair of inter-memory channel leakage of adjacent memory channels 100a and 100b in a memory array. One memory channel 122 has a channel bias of 0V and the other memory channel 124 has a channel bias of VBLC, e.g., ~0.3V. Due to a fabrication error the two memory channels are (weakly) electrically coupled to one another. The potential gradient between the channels causes current (dashed line) to leak from the channel of the memory channel 124 to the channel of the memory channel 122. The leakage occurs in the fabrication joint 112 between the upper dummy word line 110 on a drain side 104 of the memory array, and the lower dummy word line 108 on a source side 102 of the memory array. Due to the leakage current, the sensing circuits for the memory channels detect the wrong programmed voltages on the memory cells of the word line selected for programming 106 during program verify. This can lead to programming failures for any memory cells on the source side 102 of memory channels affected by the inter-memory-channel leakage current.

The upper dummy word line 110 comprises dummy memory cell 114 and dummy memory cell 116. The lower dummy word line 108 comprises dummy memory cell 118 and dummy memory cell 120. The inter-memory-channel leakage current may be substantially mitigated by raising the threshold voltage of one or more of these memory cells, as explained in more detail below.

Figure 2:
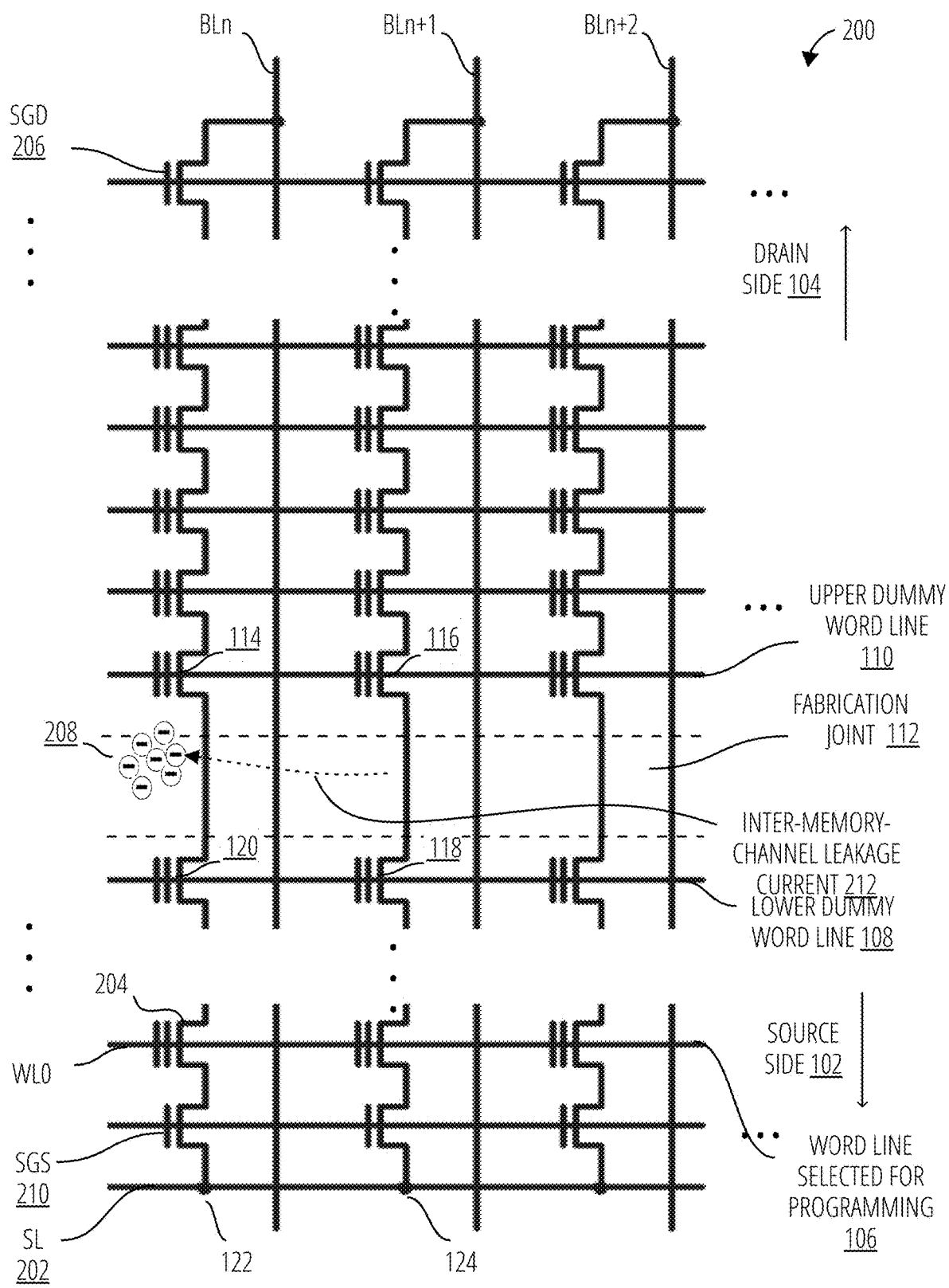
FIG. 2 illustrates a FLASH memory array 200 in accordance with one embodiment.

FIG. 2 depicts a currently programmed memory cell 204, i.e. a memory cell in the process of being programmed, in a FLASH memory array 200. Various known features are depicted, such as bitlines (Blnx), source line 202, and control gates (drain side select gate 206 and source side select gate 210). The memory channel 122 coupled to bit line Bln is uninhibited, and the currently programmed memory cell 204 is coupled to the word line selected for programming 106, e.g., WL0. The memory channels coupled to bit lines Bln+1 and Bln+2 etc. are inhibited. Memory cells on the source side 102 are in whatever state they were programmed into previously. Memory cells on the drain side 104 are still in the erased (Er) state. In this example, each of the dummy memory cell 114, dummy memory cell 116, dummy memory cell 118, and dummy memory cell 120 are programmed in a low-threshold voltage state. The potential gradient between the memory channels of BLn+1 and BLn results in charge migration 208 and an inter-memory-channel leakage current 212. This may disrupt the programming of memory cells on the source side 102.

Figure 3:
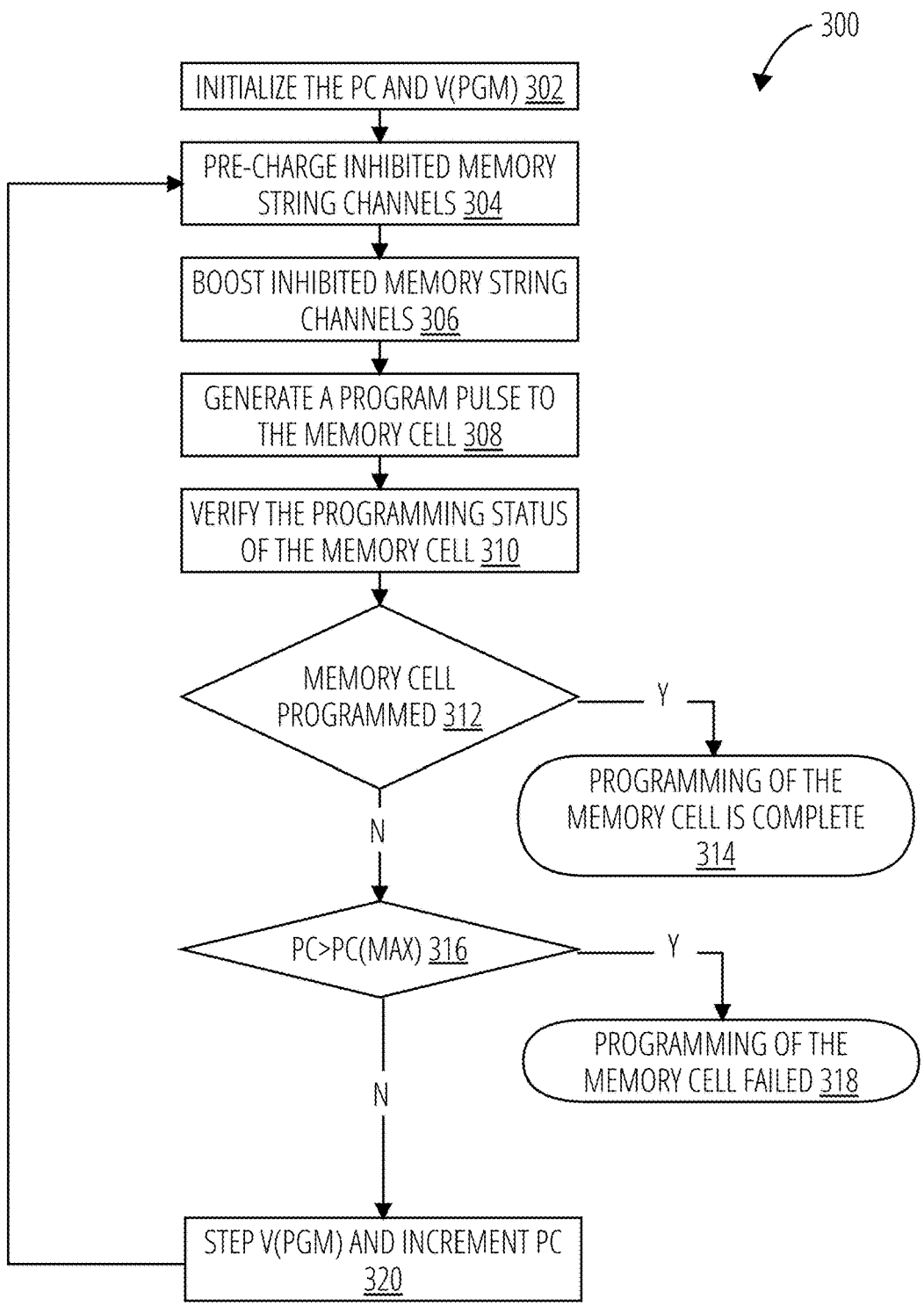
FIG. 3 illustrates a memory cell programming process 300 in accordance with one embodiment.

FIG. 3 is a flowchart illustrating one embodiment of a memory cell programming process 300. The memory cell programming process 300 may be performed by a controller, such as a controller found in a solid state drive (SSD). At block 302, the PROGRAM voltage (Vpgm) and program counter (PC) are set to initial values. V(pgm) is the PROGRAM voltage that will be applied to the selected word line for the first iteration of the memory cell programming process 300. This PROGRAM voltage may be stepped up iteratively during the process. The program counter tracks how many program pulses have been applied, such that programming can be canceled if the memory cell does not program within an allowed number of program pulses.

In one embodiment, an initial value for boosting voltages are also established at block 302. The value of boosting voltages may depend on the magnitude of the PROGRAM voltage. For example, as the PROGRAM voltage increases in magnitude during the process, the magnitude of boosting voltages can also be stepped up.

The value of boosting voltages may depend on the location of the word line relative to the word line selected for programming. Depending on the implementation, the magnitude of the boosting voltage (on any given program loop) for drain side word lines is smaller, larger, or the same as the boosting voltage for source side word lines. Also, in some implementations, using a slightly greater magnitude boosting voltage on word lines near the selected one can help to reduce the potential gradient in the memory string channel near the selected word line, and thus reduce the incidence of hot electrons in the channel.

At block 304, channels of program inhibited memory strings are pre-charged. This is referred to herein as a pre-charge phase. The pre-charge phase may involve establishing one or more pre-charge voltages in the channel of program inhibited memory strings. The magnitude of the pre-charge voltage is not typically uniform throughout the channel from the source line to the bit line. The pre-charge phase may thus result in a potential gradient in a program inhibited memory string channel near the word line that is selected for programming.

At block 306, the voltage in channels of program inhibited memory strings is boosted (this may simply be referred to as "channel boosting"). A program inhibited memory string is one that does not have a memory cell being programmed. That is, the program pulse to be applied to the selected word line should not alter the threshold voltage of any memory cells on an unselected memory string. Boosting the channels of program inhibited memory strings helps to prevent program disturb.

At block 308, a program pulse (e.g., programming voltage) is applied to the selected word line while the channels of the program inhibited memory strings are boosted. Also, a "program enable" voltage may be applied to bit lines associated with memory strings having a memory cell to receive programming. By receiving programming, it meant that the memory cell should have its threshold voltage altered. For some architectures, the program inhibit voltage could be about 2.2V, but this could vary based on design. Bit lines associated with memory cells that are being programmed are kept at a program enable voltage. For some implementations, the program enable voltage could be about 0V, but this could vary based on design.

Figure 4:
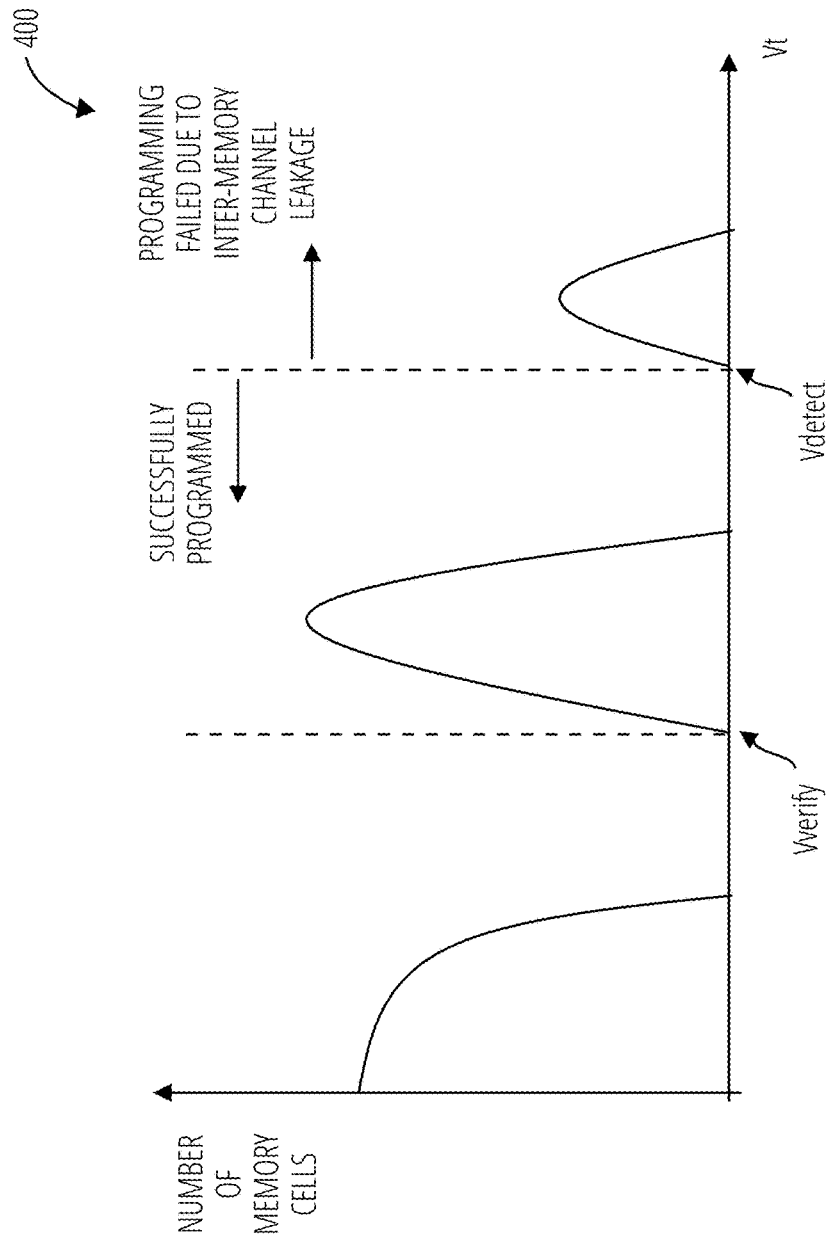
FIG. 4 illustrates a threshold voltage distributions 400 in accordance with one embodiment.

At block 310, a verification process is performed. At decision block 312, it is determined whether the threshold voltage of a memory cell was verified to be above the final target threshold voltage, Vverify as indicated in FIG. 4, for that memory cell (the value representing the value to store in the memory cell). It may not be necessary to verify that the threshold voltage of every memory cell for a given state is within the appropriate threshold voltage range. Error correction may be able to correct for some memory cells being below their target threshold voltage, Vverify. Error correction may also be able to correct for some memory cells being over-programmed, for example memory cells that have a threshold voltage above Vdetect in FIG. 4.

If verification passes, the programming process is completed successfully (status=pass) at block 314. If all of the memory cells are not all verified, then it is determined whether the program loop counter (PC) is less than a maximum value PC(MAX). The value PC(MAX) may for example fall between three and six in some implementations.

If the program counter (PC) is not less than the maximum count (decision block 316), then the program process has failed (block 318). If the program counter (PC) is less than a maximum value (e.g., 6), then the program counter (PC) is incremented by 1 and the programming voltage Vpgm is stepped up to the next value at block 320. In some embodiments, the boosting voltages are also stepped up at block 320. Subsequent to block 320, the process loops back to block 304 to prepare for and apply the next program pulse to the selected word line.

After the programming pass is completed, the data can be read from the memory cells using read reference voltages that lie within the programmed threshold voltage distributions of the memory cells. By testing whether the threshold voltage of a given memory cell is above or below one or more of the read reference voltages, the system can determine the stored value which is represented by the threshold voltage of a memory cell.

If the memory cell fails to program correctly due to the inter-memory channel leakage effects described earlier, Vpgm will have reached its highest value and the threshold voltage on the memory cell will be higher than that of a normally-programmed memory cell. This will result in a distribution of threshold voltages on memory cells in a particular memory region (e.g., a FLASH memory block) for example as depicted in the threshold voltage distributions 400 of FIG. 4, where some number of memory cells have a threshold voltage higher than would be found on a successfully programmed memory cell, such cells could be referred to as over-programmed memory cells by persons skilled in the art.

A voltage on a selected word line that would cause successfully programmed memory cells to conduct current, by overcoming their threshold voltage, will not cause conduction by memory cells that failed to program correctly due to inter-memory channel leakage, because the threshold voltage of these latter memory cells is higher than normal and could be referred to as over-programmed cells. A detection voltage Vdetect, applied to the word line, will cause conduction in the successfully programmed memory cells but not the memory cells that failed to program correctly due to inter-memory channel leakage. The voltage Vdetect is referred to herein as the "detection voltage" applied to a word line and this voltage is used to detect memory cells that are over-programmed due to inter-memory channel leakage.

Figure 5:
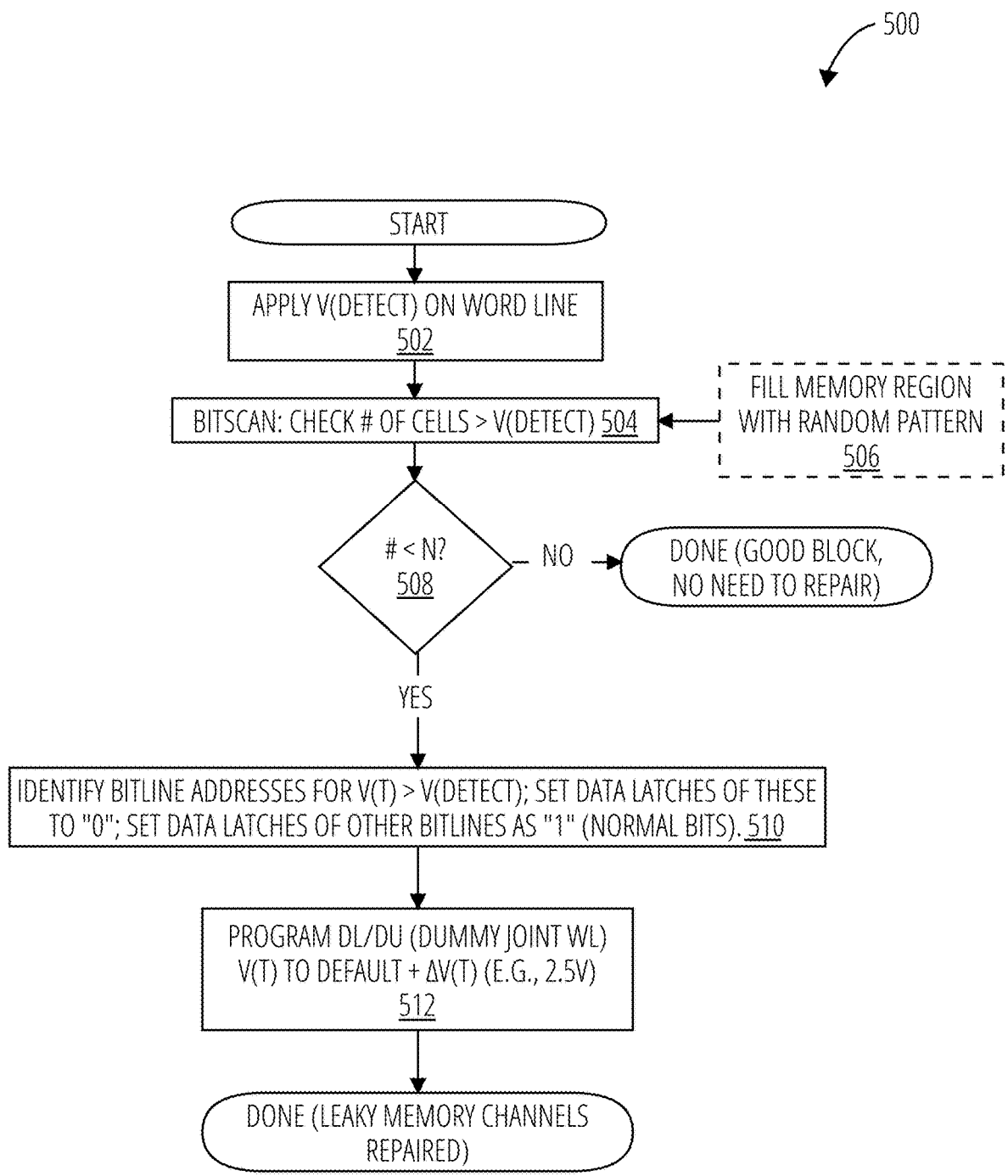
FIG. 5 illustrates a memory channel repair process 500 in accordance with one embodiment.

FIG. 5 illustrates a memory channel repair process 500 in one embodiment. Programming of memory cells in a memory block typically proceeds from the source side to the drain side of the memory array. A detection voltage is applied on a word line (block 502) to detect memory channels that were unaffected by inter-memory channel leakage (successfully programmed). A count is then made (i.e., "bitscan") to determine a number of bitlines responding to the detection voltage (block 504). Optionally, the memory region subject to the bitscan may first be programmed (initialized) with a random bit pattern (block 506). The difference between a total number of bitlines on the word line, and the ones that responded to the detection voltage, is a count of the memory cells that failed to program correctly due to inter-memory channel leakage.

If the count (decision block 508) is below a tolerable threshold, the process concludes without repair. Otherwise repair is undertaken (block 510) by first identifying which bitlines failed to respond to the detection voltage (the "aberrant bitlines").

The data latches for these aberrant bitlines may then be set to "0" (for example); and the data latches for other bitlines along the word line may be set to "1" (or the opposite logical value of whatever the high threshold voltage bitlines were set to). With aberrant bitlines having a corresponding data latch set to "0", the controller can identify the bitlines to program as those in the "0"-state (program state) while all other bitlines are set to the "1"-state (inhibit state) and are not programmed.

One or more of the memory cells along both of the upper and lower dummy word lines, adjacent to the fabrication joint in the aberrant bitlines, are then programmed into a high threshold voltage state (block 512).

Figure 6:
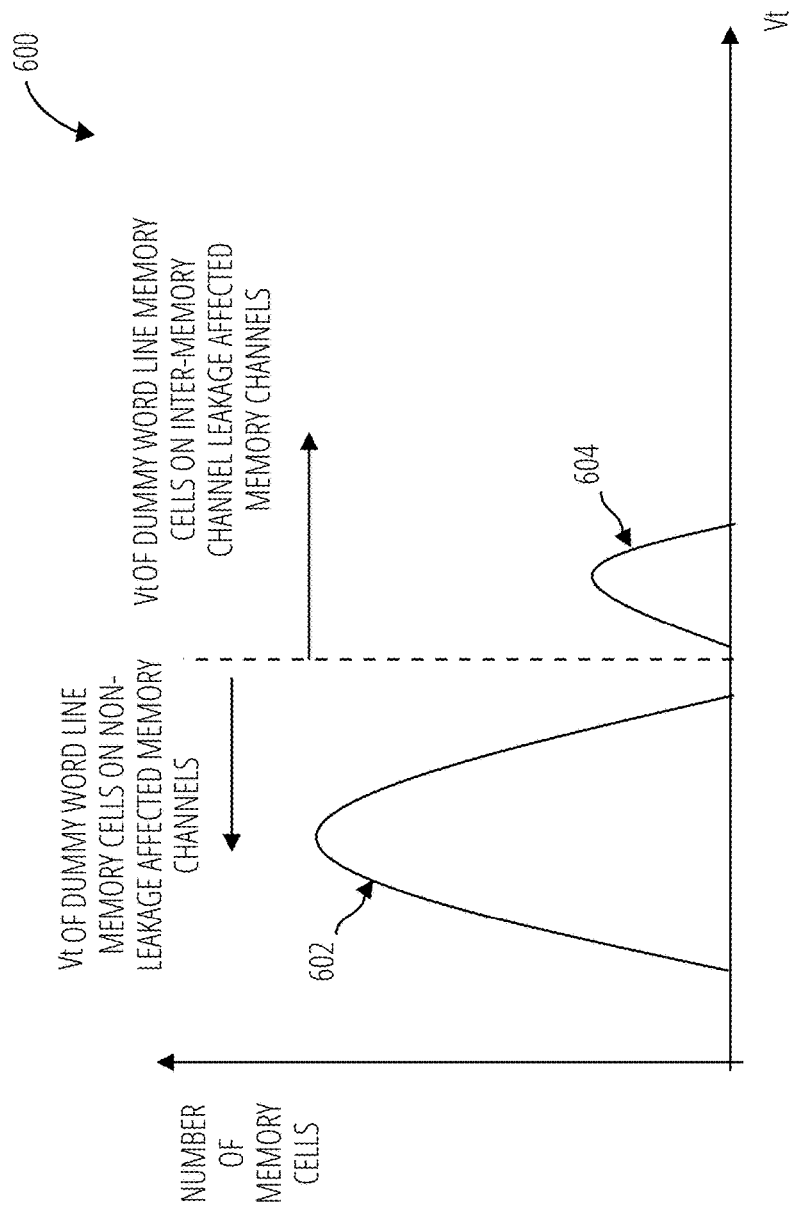
FIG. 6 illustrates a threshold voltage distributions 600 in accordance with one embodiment.

FIG. 6 depicts an example of a threshold voltage distributions 600 for memory cells on dummy word lines adjacent to a fabrication joint after the memory channel repair process 500. Memory cells on the dummy word lines adjacent the fabrication joint, on memory channels unaffected by inter-memory channel leakage, have the typical threshold voltage distribution 602 for such dummy memory cells used in the implementation (this will vary). Other memory cells on the dummy word lines adjacent the fabrication joint, on memory channels affected by inter-memory channel leakage (the aberrant bitlines), have a higher threshold voltage distribution 604. In one embodiment, this higher threshold voltage distribution 604 is on average about 2.5V higher than for the memory cells on the unaffected memory channels.

Figure 7:
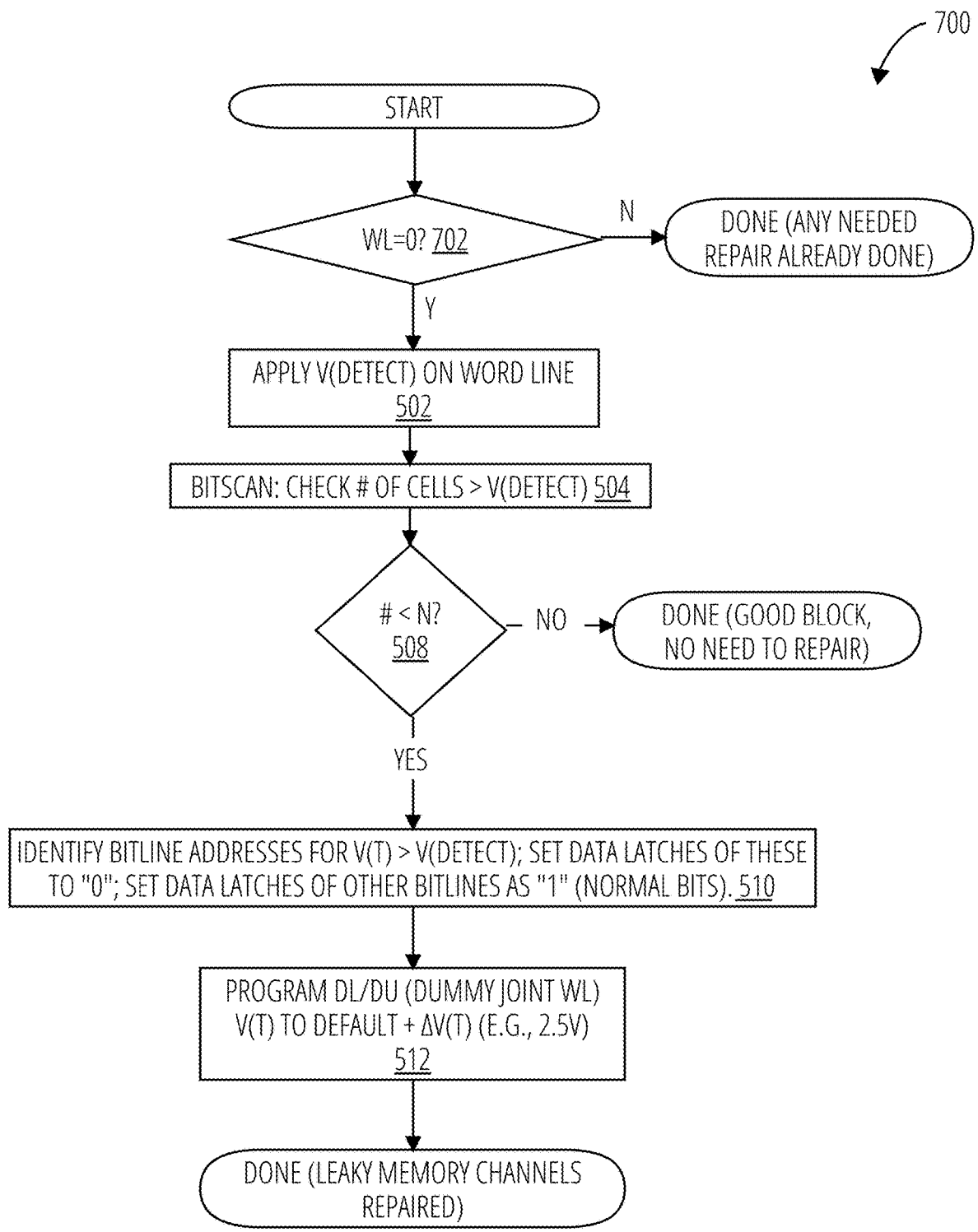
FIG. 7 illustrates a memory channel repair process 700 in accordance with one embodiment.

The memory channel repair process 700 depicted in FIG. 7 illustrates a possible optimization in which detection and repair for a memory region is only undertaken when programming one word line in the programming order. This one word line could be the first word line in the programming order, e.g., word line 0 (see decision block 702). For other word lines in the programming order, the detection/repair is not undertaken.

Figure 8:
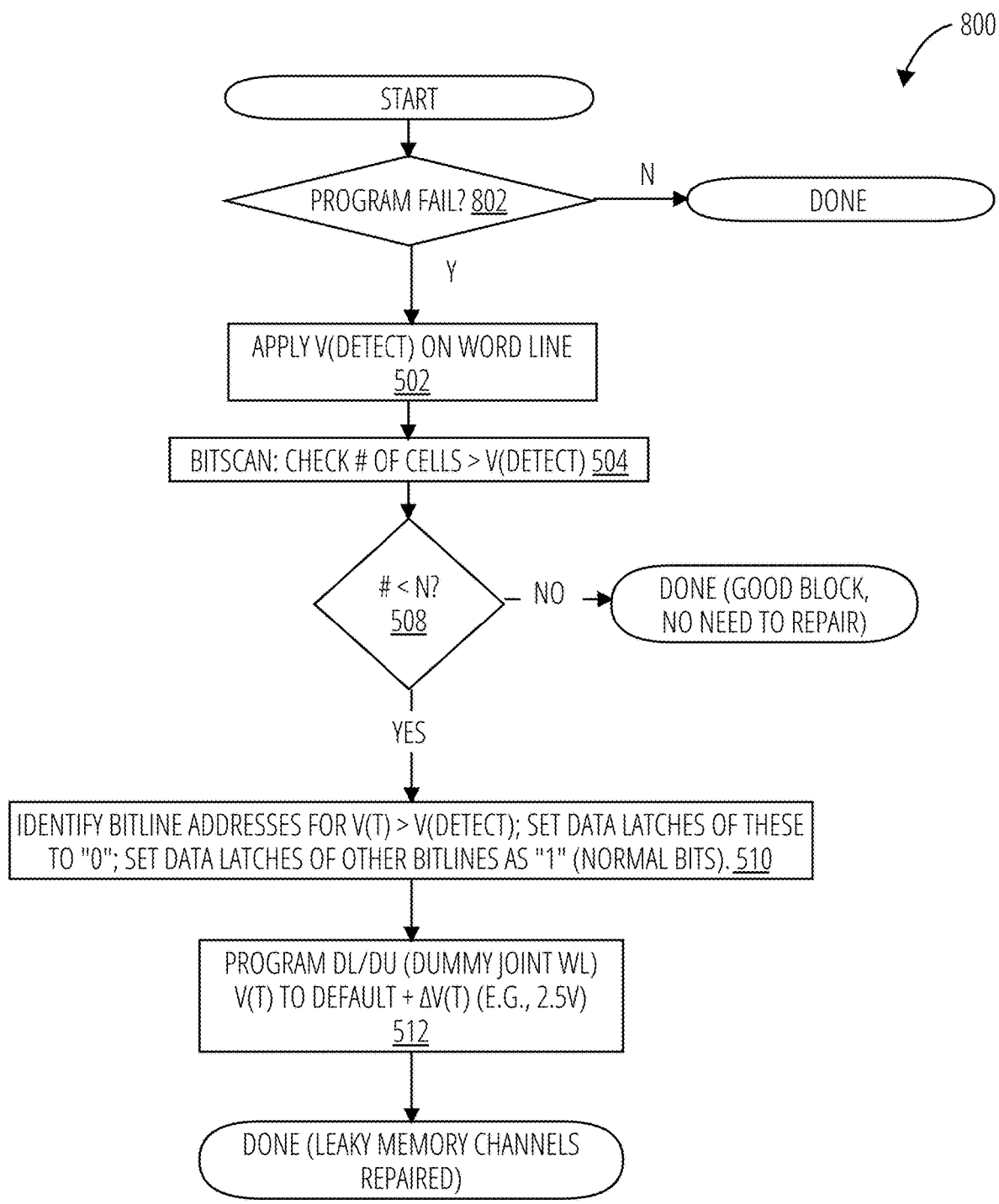
FIG. 8 illustrates a memory channel repair process 800 in accordance with one embodiment.

The memory channel repair process 800 depicted in FIG. 8 illustrates yet another possible optimization in which the detection and repair is undertaken on condition that a program operation fails (decision block 802). The repair could be undertaken for a first program fail, or after a preconfigured number of program fails in the memory region or for memory cells on a particular word line.

Figure 9:
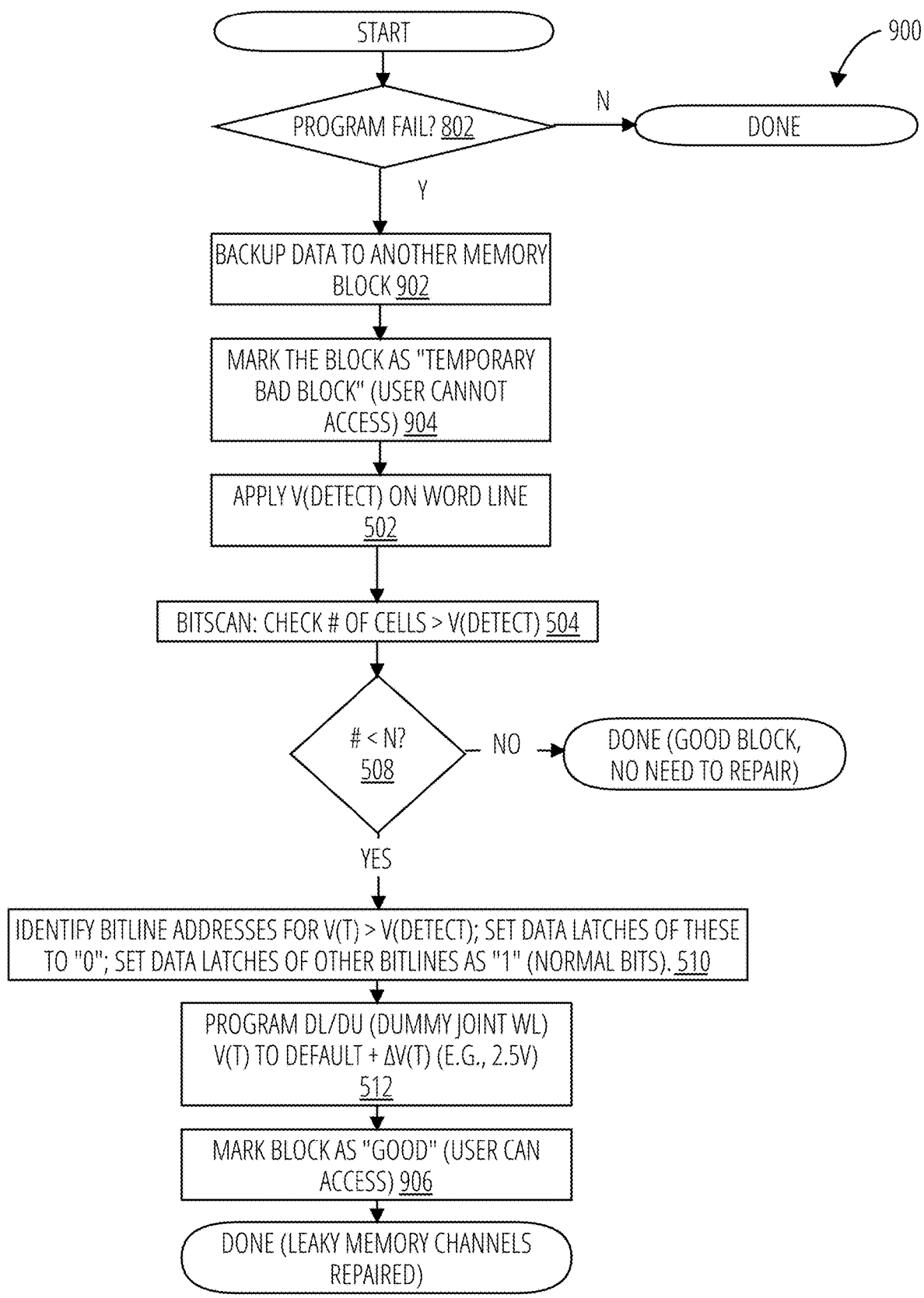
FIG. 9 illustrates a memory channel repair process 900 in accordance with one embodiment.

The memory channel repair process 900 depicted in FIG. 9 illustrates a variation in which a program fail, or too many program failures, causes a memory region (e.g., memory block) to be backed up (block 902) and marked temporarily as "bad" (block 904) and unavailable for use. The detection and repair process is then carried out and upon successful completion, the block is marked as "good" for use (block 906).

Figure 10:
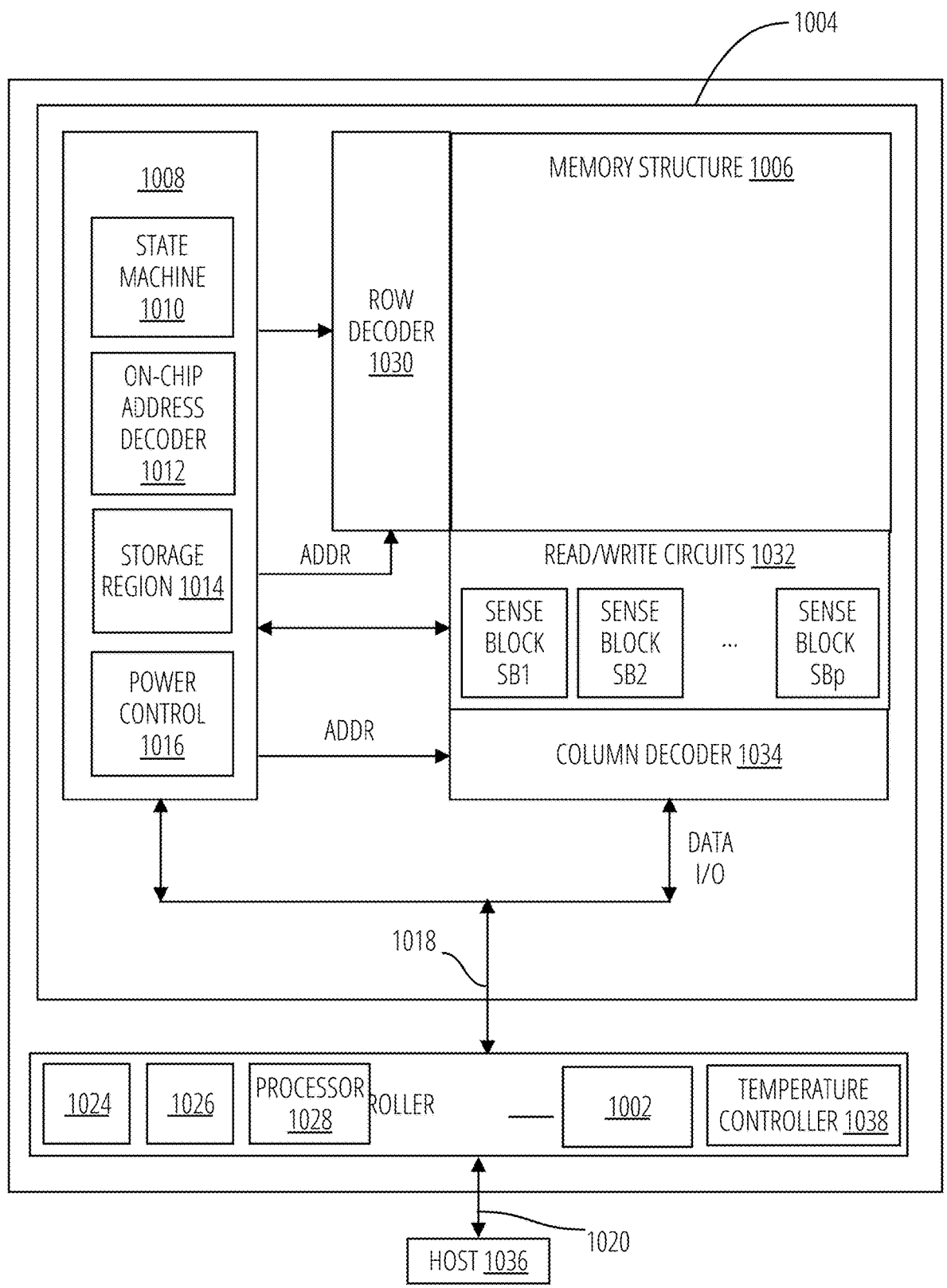
FIG. 10 is a block diagram of an example memory device in one embodiment.

FIG. 10 is a block diagram of an exemplary memory device. The memory device may include one or more memory die 1004. The memory die 1004 includes a memory structure 1006 of memory cells, such as an array of memory cells herein referred to as a memory array, an address controller 1008, and read/write circuits 1032. The memory structure 1006 is addressable by word lines via a row decoder 1030 and by bit lines via a column decoder 1034. The read/write circuits 1032 include multiple sense blocks SB1, SB2, . . . , SBp (sensing circuitry) and allow a page of memory cells to be read or programmed in parallel. Typically a read/write controller 1022 is included in the same memory device (e.g., a removable storage card) as the one or more memory die 1004. Commands and data are transferred between the host device 1036 and read/write controller 1022 via a data bus 1020, and between the controller and the one or more memory die 1004 via lines 1018.

The memory structure 1006 can be 2D (laid out in a single fabrication plane) or 3D (laid out in multiple fabrication planes). The memory structure 1006 may comprise one or more array of memory cells including a 3D array. In one embodiment, the memory structure 1006 may comprise a monolithic three-dimensional memory structure (3D array) in which multiple memory levels are formed above (and not in) a single substrate, such as a wafer, with no intervening substrates. The memory structure 1006 may comprise any type of non-volatile memory that is monolithically formed in one or more physical levels of arrays of memory cells having an active area disposed above a silicon substrate. The memory structure 1006 may be in a non-volatile memory device having circuitry associated with the operation of the memory cells, whether the associated circuitry is above or within the substrate.

The address controller 1008 cooperates with the read/write circuits 1032 to perform memory operations on memory cells of the memory structure 1006, and includes a state machine 1010, an address decoder 1012, a temperature controller 1038, and a power control 1016. The state machine 1010 provides chip-level control of memory operations. A store region selector 1014 may be provided, e.g., for programming parameters as described further below.

The address decoder 1012 provides an address interface between that used by the host or a read/write controller 1022 to the hardware address used by the row decoder 1030 and column decoder 1034. The power control 1016 controls the power and voltages supplied to the various control lines during memory operations. The power control 1016 and/or read/write circuits 1032 can include drivers for word lines, source gate select (SGS) transistors, drain gate select (DGS) transistors, bit lines, substrates (in 2D memory structures), charge pumps, and source lines. The power control 1016 can therefore include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than memory structure 1006, can be thought of as at least one control circuit or controller which is configured to perform the techniques described herein. For example, a control circuit may include any one of, or a combination of, address controller 1008, state machine 1010, address decoder 1012, column decoder 1034, power control 1016, control processor 1028, error correction unit 1002, sense blocks SB1, SB2, . . . , SBp, read/write circuits 1032, read/write controller 1022, and so forth.

The read/write controller 1022 may comprise a control processor 1028, memory devices (memory) such as controller read-only memory 1024 and controller volatile memory 1026, and other functional units known in the art.

The memory devices of the read/write controller 1022 may comprise code such as a set of instructions, and the control processor 1028 is operable to execute the set of instructions to provide aspects of the functionality described herein. Alternatively or additionally, the control processor 1028 can access code from the memory structure 1006, such as a reserved area of memory cells in one or more word lines.

Figure 11:
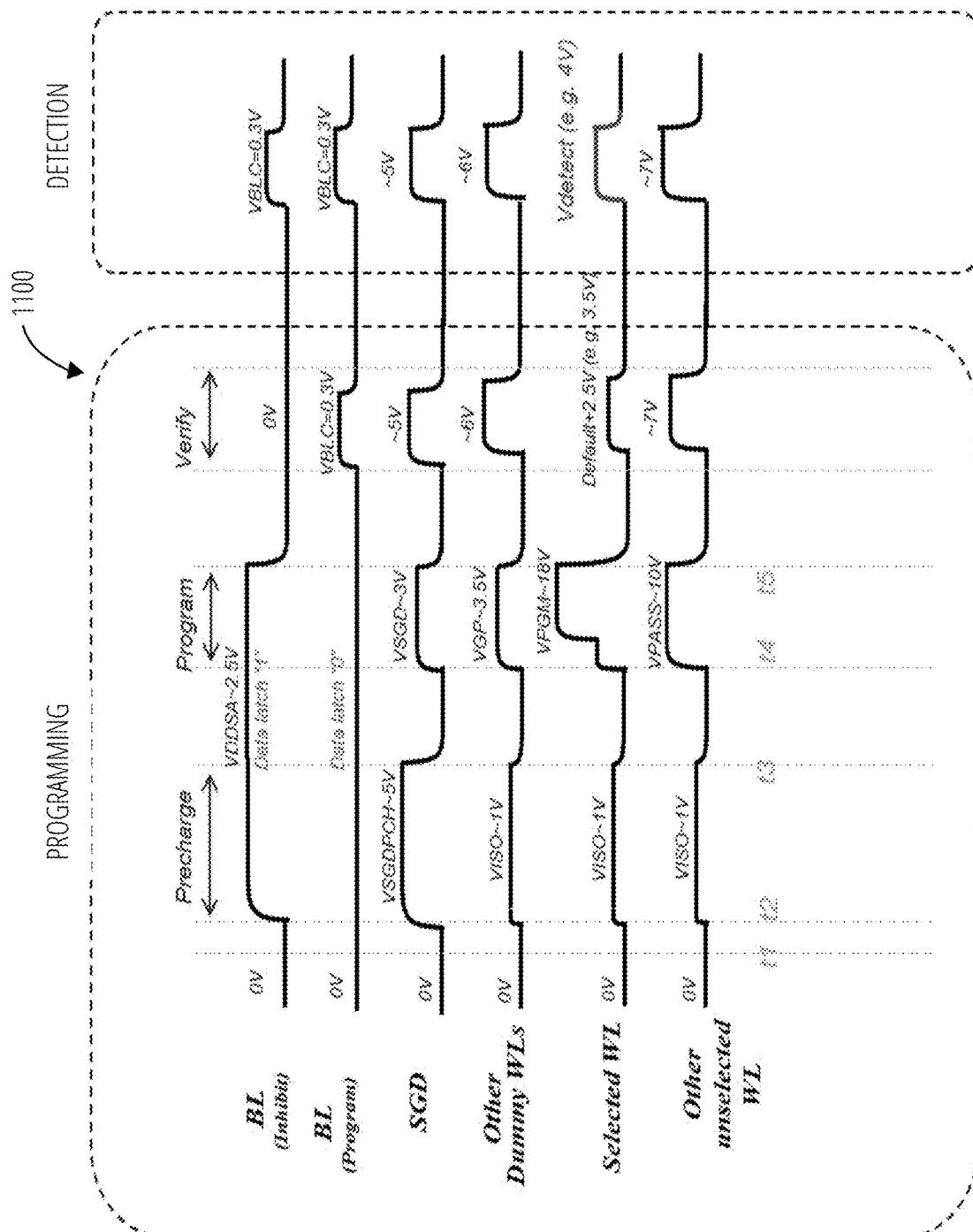
FIG. 11 illustrates a controller signals 1100 in accordance with one embodiment.
Figure 12:
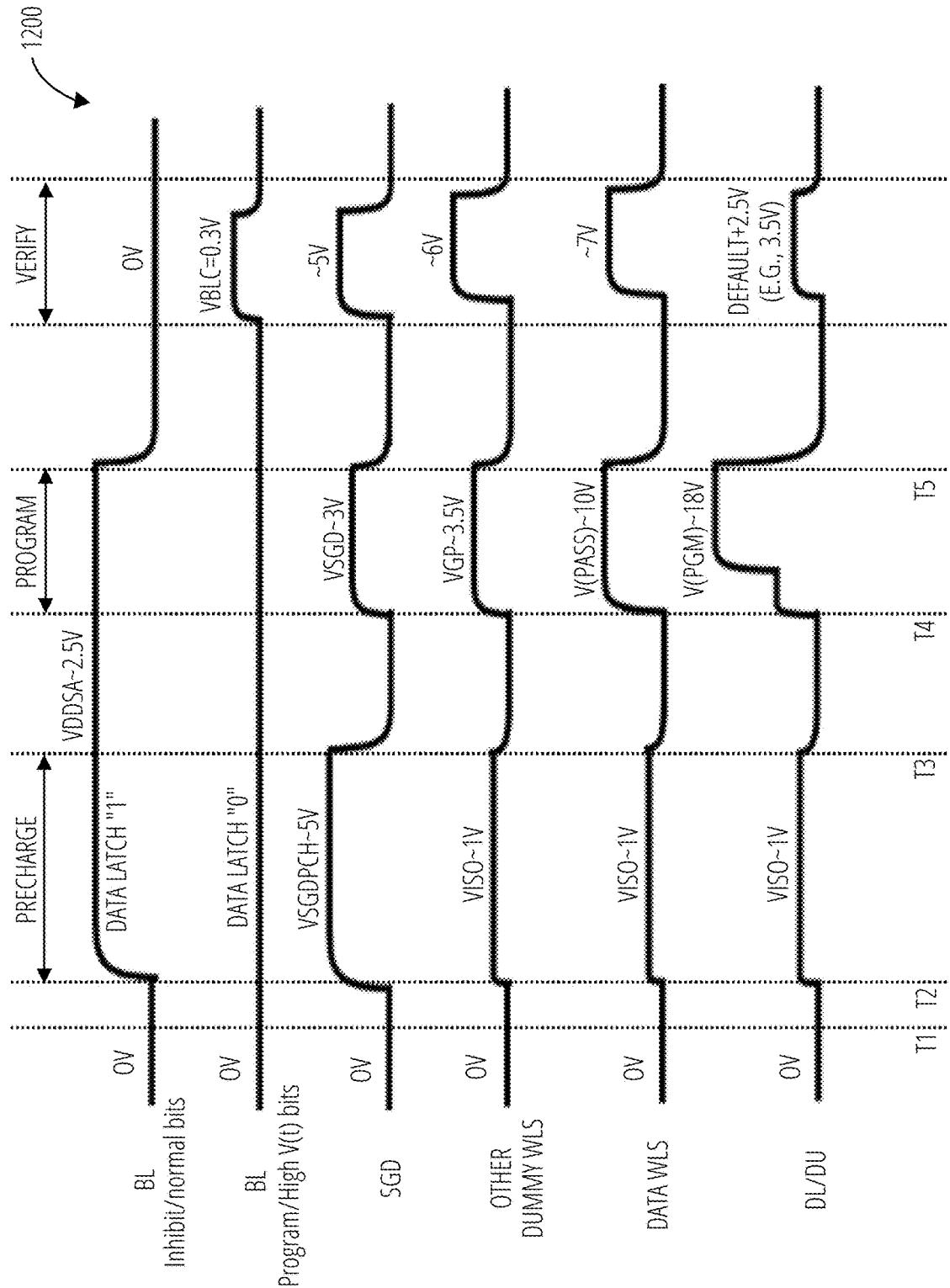
FIG. 12 illustrates a controller signals 1200 in accordance with one embodiment.

For example, code can be used by the read/write controller 1022 to access the memory structure 1006 for programming (write), read, and reset operations. The code can include boot code and control code (e.g., set of instructions). The boot code is software that initializes the read/write controller 1022 during a booting or startup process and enables the read/write controller 1022 to access the memory structure 1006. The code can be used by the read/write controller 1022 to control one or more memory structures. FIG. 11 illustrates exemplary controller signals 1100 to perform detection of memory channels affected by inter-memory channel leakage during programming as described herein in conjunction with particular embodiments. FIG. 12 illustrates exemplary controller signals 1200 to perform memory channel repair as described herein in conjunction with particular embodiments. Those of regular skill in the art will recognize the various signal designations and phases of programming depicted and these need not be elaborated further.

In one embodiment, upon being powered up, the control processor 1028 fetches the boot code from the controller read-only memory 1024 or memory structure 1006 for execution, and the boot code initializes the system components and loads the control code into the controller volatile memory 1026. Once the control code is loaded into the controller volatile memory 1026, it is executed by the control processor 1028. The control code includes drivers to perform basic tasks such as controlling and allocating memory, prioritizing the processing of instructions, and controlling input and output ports.

Generally, the control code can include instructions to configure one or more controller to perform the functions described herein. For example the control code can implement a sequencer to control the timing (start and stop times, durations, spacing etc.) of the various actions described herein.

In one embodiment, the host device 1036 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the read/write controller 1022 to perform the methods described herein. The host may also include additional system memory, one or more input/output interfaces and/or one or more input/output devices in communication with the one or more processors, as well as other components well known in the art.

The store region selector 1014 may be a non-volatile memory such as NAND flash memory, or another type, implementing a memory map or address translation table. Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A memory device comprising:
    a memory array having memory channels, each memory channel having memory cells and a fabrication joint; and
    a controller configured to:
        program the memory cells of the memory channels with user data;
        detect a number of memory cells that failed to program correctly with the user data in response to the memory cells satisfying a threshold;
        determine bitlines corresponding to the memory cells that failed to program correctly;
        increase a threshold voltage for particular dummy memory cells on at least one dummy word line adjacent to a fabrication joint of memory channels connected to the determined bitlines, the particular dummy memory cells positioned within the memory channels connected to the determined bitlines; and
        wherein the threshold voltage is configured to mitigate current leakage between adjacent memory channels.

2. The memory device of claim 1, wherein detecting the number of memory cells that failed to program correctly comprises subtracting a first number of bitlines not satisfying the threshold from a total number of bitlines on a word line.

3. The memory device of claim 1, the controller further configured to:
    apply a detection voltage satisfying a highest successful program threshold voltage and determine the number of the memory cells that failed to program correctly in response to a programming failure.

4. The memory device of claim 3, the controller further configured to:
    in response to the programming failure, perform a backup of data in a memory region in which the programming failure occurred;
    mark the memory region as unavailable for use;
    increase the threshold voltage for the at least one dummy memory cell on the at least one dummy word line adjacent to the fabrication joint; and
    mark the memory region as available for use.

5. The memory device of claim 3, the controller further configured to:
    detect the number of the memory cells that failed to program correctly only for a single particular word line of a plurality of word lines of the memory array.

6. The memory device of claim 5, wherein the single particular word line is word line 0.

7. The memory device of claim 5, the controller further configured to:
    determine the number of the memory cells that failed to program correctly on condition that the programming failure occurs on the single particular word line.

8. The memory device of claim 1, the controller further configured to:
    initialize a region of the memory array comprising the memory channels with a random data pattern.

9. An apparatus comprising:
    a controller configured to:
        program memory cells of a memory array comprising a fabrication joint, by setting threshold voltages on the memory cells;
        detect a number of memory cells that failed to program correctly in response to applying a detection voltage on at least one word line of the memory array;
        determine one or more bitlines corresponding to the memory cells that failed to program correctly; and
        program particular dummy memory cells on at least one dummy word line adjacent to the fabrication joint, the particular dummy memory cells programmed to a particular threshold voltage configured to mitigate current leakage between memory channels of the memory cells that failed to program correctly.

10. The apparatus of claim 9, wherein detecting the number of the memory cells that failed to program correctly comprises subtracting a first number of bitlines not responding to the detection voltage from a total number of bitlines subjected to the detection voltage.

11. The apparatus of claim 9, the detection voltage satisfying a highest successful program threshold voltage for the memory cells.

12. The apparatus of claim 11, further configured to:
    in response to a programming failure, perform a backup of data in a memory region in which the programming failure occurred;
    repair memory channels corresponding to the memory cells that failed to program correctly;
    detect the number of memory cells that failed to program in response to applying the detection voltage on at least one word line selected for programming; and
    mark the memory region as available for use.

13. The apparatus of claim 11, further configured to:
    detect the number of the memory cells that failed to program correctly only for a single particular word line of a plurality of word lines of the memory array.

14. The apparatus of claim 13, wherein the single particular word line is word line 0.

15. The apparatus of claim 13, further configured to:
    determine the number of the memory cells that failed to program correctly on condition that a programming failure occurs on the single particular word line.

16. The apparatus of claim 9, further configured to:
    initialize a region of the memory array comprising the memory cells with a random data pattern.

17. An apparatus comprising:
    memory means comprising memory cells and a fabrication joint;
    means for detecting a number of memory cells that failed to program correctly in response to applying a detection voltage on at least one word line of the memory means; and
    means for increasing a threshold voltage for particular dummy memory cells on at least one dummy word line adjacent to the fabrication joint, the particular dummy memory cells located within memory channels of the memory cells that failed to program correctly and wherein the particular dummy memory cells acquire a particular threshold voltage configured to mitigate current leakage between memory channels of the memory cells that failed to program correctly.

18. The apparatus of claim 17, further comprising means for performing a backup of data from the memory means.

19. The apparatus of claim 17, further comprising:
means for detecting the number of the memory cells that failed to program correctly only for a single particular word line of a plurality of word lines of the memory means.

20. The apparatus of claim 19, wherein the single particular word line is word line 0.

* * * * *